United States Patent [19]

Eyuboglu

[11] Patent Number: 4,713,829
[45] Date of Patent: Dec. 15, 1987

[54] CODED MODULATION SYSTEM WITH A SIMPLIFIED DECODER CAPABLE OF REDUCING THE EFFECTS OF CHANNEL DISTORTION

[75] Inventor: Vedat M. Eyuboglu, Boston, Mass.
[73] Assignee: Codex Corporation, Mansfield, Mass.
[21] Appl. No.: 746,538
[22] Filed: Jun. 19, 1985
[51] Int. Cl.$^4$ ............................................. H04L 27/00
[52] U.S. Cl. ...................................... 375/37; 375/94; 329/104
[58] Field of Search .................. 375/25, 37, 39, 42, 375/59, 94; 371/43, 44, 45; 332/9 R, 16 R; 370/19, 20, 21; 329/104

[56] References Cited

U.S. PATENT DOCUMENTS

| | | | |
|---|---|---|---|
| 4,077,021 | 2/1978 | Csajka et al. | 332/9 |
| 4,447,908 | 5/1984 | Chevillat et al. | 332/16 R |
| 4,483,012 | 4/1984 | Wei | 371/43 |
| 4,520,490 | 5/1985 | Wei | 375/39 |
| 4,534,040 | 8/1985 | Thapar | 375/59 |
| 4,562,425 | 12/1985 | Turner et al. | 332/9 R |
| 4,562,426 | 12/1985 | Forney, Jr. | 375/27 |
| 4,581,601 | 4/1986 | Calderbank et al. | 375/94 |
| 4,583,236 | 4/1986 | Kromer et al. | 375/39 |
| 4,586,182 | 4/1986 | Gallager | 375/25 |

OTHER PUBLICATIONS

Falconer, "Application of Passband Decision Feedback Equalization in Two-Dimensional Data Communication Systems", IEEE Transactions on Communications, Oct. 1976, pp. 1159-1166.
Forney, "Maximum-Likelihood Sequence Estimation of Digital Sequences in the Presence of Intersymbol Interference", IEEE Transactions on Information Theory, vol. IT-18, No. 3, May, 1972, pp. 363-378.
Qureshi and Newhall, "An Adaptive Receiver for Data Transmission Over Time-Dispersive Channels", IEEE Transactions on Information Theory, vol. IT-19, No. 4, Jul. 1973, pp. 448-457.
Ungerboeck, "Channel Coding with Multilevel/Phase Signals", IEEE Transactions on Information Theory, vol. IT-28, No. 1, Jan., 1982, pp. 55-67.
Forney, "The Viterbi Algorithm", Proceedings of the IEEE, vol. 6, No. 3, Mar., 1973, pp. 268-278.
Qureshi, "Adaptive Equalization", IEEE Communications Magazine, Mar., 1982, pp. 9-16.
Belfiore and Park, "Decision Feedback Equalization", Proceedings of the IEEE, vol. 67, No. 8, Aug. 1979, pp. 1143-1156.
Falconer and Magee, "Adaptive Channel Memory Truncation for Maximum Likelihood Sequence Estimation", Bell System Technical Journal, vol. 52, Nov., 1973, pp. 1541-1562.
Qureshi, "An Adaptive Decision-Feedback Receiver Using Maximum Likelihood Sequence Estimation," IEEE International Conference on Communications Record, 1973, pp. 1410-1416.
Lee and Hill, "A Maximum Likelihood Sequence Estimator with Decision-Feedback Equalization," IEEE Transactions on Communications, vol. COM-25, No. 9, Sep., 1977, pp. 971-979.

Primary Examiner—Robert L. Griffin
Assistant Examiner—Stephen Chin

[57] ABSTRACT

A receiver for deciding which signal points were sent from a transmitter based on corresponding noise affected signals received via a distorting channel, the noise affected signals carrying information about a particular sequence of encoding states occupied in a succession of time intervals by a finite state process having a finite number of possible encoding states, the receiver including modifying circuitry for generating a plurality of different modified versions of each received signal, and a decoder for deciding which signal points were sent based on estimating a particular sequence of decoder states by storing a number of path histories of previous signal points and using the modified versions to extend the path histories, the different modified versions of each received signal numbering fewer than the number of stored path histories. In other aspects, the constellation of signal points is partitioned into decision subsets, each possible transitions from a possible decoder state are associated with a decision subset, based on the signal points in the path histories, and each of the modified versions is associated with one of the decision subsets; there are fewer modified versions than the number of decoder states; and the decoder states number fewer than the number of decoder states in an optimum trellis decoder.

30 Claims, 17 Drawing Figures

FIG I    PRIOR ART

| $I1_{n+1}$ | $I2_{n+1}$ | $I3_{n+1}$ | $Z2_n$ | $Z3_n$ | $Z2_{n+1}$ | $Z3_{n+1}$ |
|---|---|---|---|---|---|---|
| 0 | 0 | 0 | 0 | 0 | 0 | 0 |
| 0 | 0 | 1 | 0 | 0 | 0 | 1 |
| 0 | 1 | 0 | 0 | 0 | 1 | 0 |
| 0 | 1 | 1 | 0 | 1 | 1 | 0 |
| 1 | 0 | 0 | 1 | 0 | 0 | 0 |
| 1 | 0 | 1 | 1 | 0 | 0 | 1 |
| 1 | 1 | 0 | 0 | 1 | 0 | 0 |
| 1 | 1 | 1 | 0 | 1 | 0 | 1 |

FIG II

NUMBER BENEATH EACH POINT: $Z2_{n+i}$ $Z3_{n+i}$ $Z4_{n+i}$ $Z5_{n+i}$ $Z6_{n+i}$ $Z7_{n+i}$ ( i = 0 or 1 )

FIG 8

| 4D SUBSET | YO$_n$ | I1$_n$ | I2$_n$ | I3'$_n$ | 2D SUBSET | ZO$_n$ | ZI$_n$ | ZO$_{n+1}$ | ZI$_{n+1}$ |
|---|---|---|---|---|---|---|---|---|---|
| 0  | 0 | 0 | 0 | 0 | (A,A) | 0 | 0 | 0 | 0 |
| 1  | 0 | 0 | 0 | 1 | (B,B) | 0 | 1 | 0 | 1 |
| 2  | 0 | 0 | 1 | 0 | (C,C) | 1 | 0 | 1 | 0 |
| 3  | 0 | 0 | 1 | 1 | (D,D) | 1 | 1 | 1 | 1 |
| 4  | 0 | 1 | 0 | 0 | (A,B) | 0 | 0 | 0 | 1 |
| 5  | 0 | 1 | 0 | 1 | (B,A) | 0 | 1 | 0 | 0 |
| 6  | 0 | 1 | 1 | 0 | (C,D) | 1 | 0 | 1 | 1 |
| 7  | 0 | 1 | 1 | 1 | (D,C) | 1 | 1 | 1 | 0 |
| 8  | 1 | 0 | 0 | 0 | (A,C) | 0 | 0 | 1 | 0 |
| 9  | 1 | 0 | 0 | 1 | (B,D) | 0 | 1 | 1 | 1 |
| 10 | 1 | 0 | 1 | 0 | (C,B) | 1 | 0 | 0 | 1 |
| 11 | 1 | 0 | 1 | 1 | (D,A) | 1 | 1 | 0 | 0 |
| 12 | 1 | 1 | 0 | 0 | (A,D) | 0 | 0 | 1 | 1 |
| 13 | 1 | 1 | 0 | 1 | (B,C) | 0 | 1 | 1 | 0 |
| 14 | 1 | 1 | 1 | 0 | (C,A) | 1 | 0 | 0 | 0 |
| 15 | 1 | 1 | 1 | 1 | (D,B) | 1 | 1 | 0 | 1 |

FIG 10

CURRENT STATE ↓

| Current State | Next State 0 1 2 3 | 4 5 6 7 | 8 9 10 11 | 12 13 14 15 | 16 17 18 19 | 20 21 22 23 | 24 25 26 27 | 28 29 30 31 |
|---|---|---|---|---|---|---|---|---|
| 0 1 2 3 | 0 1 4 5 | 2 3 6 7 | 8 9 12 13 | 10 11 14 15 | 4 5 0 1 | 6 7 2 3 | 12 13 8 9 | 14 15 10 11 |
| 4 5 6 7 | 1 0 5 4 | 3 2 7 6 | 9 8 13 12 | 11 10 15 14 | 5 4 1 0 | 7 6 3 2 | 13 12 9 8 | 15 14 11 10 |
| 8 9 10 11 | 4 5 0 1 | 6 7 2 3 | 12 13 8 9 | 14 15 10 11 | 0 1 4 5 | 2 3 6 7 | 8 9 12 13 | 10 11 14 15 |
| 12 13 14 15 | 5 4 1 0 | 7 6 3 2 | 13 12 9 8 | 15 14 11 10 | 1 0 5 4 | 3 2 7 6 | 9 8 13 12 | 11 10 15 14 |
| 16 17 18 19 | 2 3 6 7 | 0 1 4 5 | 10 11 14 15 | 8 9 12 13 | 6 7 2 3 | 4 5 0 1 | 14 15 10 11 | 12 13 8 9 |
| 20 21 22 23 | 3 2 7 6 | 1 0 5 4 | 11 10 15 14 | 9 8 13 12 | 7 6 3 2 | 5 4 1 0 | 15 14 11 10 | 13 12 9 8 |
| 24 25 26 27 | 6 7 3 2 | 4 5 0 1 | 14 15 10 11 | 12 13 8 9 | 2 3 6 7 | 0 1 4 5 | 10 11 14 15 | 8 9 12 13 |
| 28 29 30 31 | 7 6 3 2 | 5 4 1 0 | 15 14 11 10 | 13 12 9 8 | 3 2 7 6 | 1 0 5 4 | 11 10 15 14 | 9 8 13 12 |

CURRENT STATE = $W1_n$ $W2_n$ $W3_n$ $W4_n$ $W5_n$ $W6_n$

NEXT STATE = $W1_{n+2}$ $W2_{n+2}$ $W3_{n+2}$ $W4_{n+2}$ $W5_{n+2}$ $W6_{n+2}$

4D SUBSET = $Y0_n$ $I1_n$ $I2_n$ $I3'_n$

CODED MODULATION SYSTEM WITH A SIMPLIFIED DECODER CAPABLE OF REDUCING THE EFFECTS OF CHANNEL DISTORTION

BACKGROUND OF THE INVENTION

This invention relates to modulated carrier systems, for example so-called coded type systems in which digital symbols to be sent over a band-limited channel are encoded as a sequence of discrete signal points selected from an available signal point alphabet, with dependencies being introduced between successive signal points in the sequence to increase immunity to noise and distortion.

In typical such coded systems, for example the systems described in Csajka et al., U.S. Pat. No. 4,077,021, and Ungerboeck, "Channel Coding with Multilevel/Phase Signals", IEEE Transactions on Information Theory, Vol. IT-28, No. 1, January, 1982, information about the dependencies between successive signal elements is exploited at the receiver using a decoding technique based on the Viterbi algorithm described in Forney, "The Viterbi Algorithm", Proceedings of the IEEE, 61(3): 268 (March 1973), incorporated herein by reference. In such a technique, instead of decoding each received signal independently into the signal point closest to the received signal in the sense of Euclidean distance a sequence of received signals is decoded into the sequence of signal points closest to the sequence of received signals in the sense of the algebraic sum of squared Euclidean distances. In such coded systems, final decisions are delayed for a sufficient number of signaling intervals to assure to an acceptably high probability that the sequence of which signal points were sent will be correctly decided. By contrast to coded systems, in conventional uncoded systems each symbol is encoded into a signal point based only on the symbol to be encoded, with no dependencies between successive signal points; at the receiver, decoding proceeds one symbol at a time.

Receivers for data transmission systems typically include an equalizer to reduce the effects of intersymbol interference introduced by the channel, as described in Qureshi, "Adaptive Equalization", IEEE Communications Magazine, March, 1982, incorporated herein by reference. A so-called linear equalizer for a quadrature amplitude modulation (QAM) system, for example, is typically a transversal filter which takes samples of a received signal, multiplies each sample by a complex coefficient, and adds the products to obtain an equalized received signal for use in decoding. For channels with severe amplitude distortion, such a linear transversal equalizer enhances noise and correlates the noise in successive intervals. In coded systems using the conventional Viterbi algorithm decoder, such noise correlation will increase the probability of making decision errors.

In conventional uncoded systems, a decision feedback type equalizer (DFE) can be substituted for the linear equalizer to perform equalization with less noise enhancement. DFEs also have the property of producing uncorrelated noise samples. DFEs are described in the Qureshi article cited above, in C. A. Belfiore and J. H. Park, Jr., "Decision Feedback Equalization", Proceedings of the IEEE, August, 1979, and in D. D. Falconer, "Application of Passband Decision Feedback Equalization in Two-Dimensional Data Communication Systems", IEEE Transactions on Communications, October, 1976, incorporated herein by reference. Generally, a DFE multiplies previous decisions by feedback coefficients and sums the products to produce a value to be applied to the demodulated, partly equalized, undecoded received signal to correct for the anticipated channel intersymbol interference (due to previous signal points) in the currently received signal.

Receivers for conventional uncoded systems sometimes use modified DFEs (which may be called noise predictors) to predict and compensate for the noise component in the received signal, as described in the Belfiore and Park article. The noise predictor output is a weighted sum of past error signals (each based on a comparison of a past received signal with the corresponding decision), where the weighting coefficients are selected to minimize the average power of the residual noise signals after prediction by removing the correlation which exists between successive error signals before prediction. Unlike the conventional DFEs, in noise predictors the coefficients of the linear (or forward) equalizer are independent of the noise predictor (or feedback) coefficients. The forward equalizer coefficients can be updated to minimize the mean square error before prediction as in a conventional linear equalizer. Typically the number of feedback coefficients is small. For example, in high-speed voice-band modems a single coefficient can be sufficient even for worst case channels and high baud rates of the order of 2800 Baud. FIG. 1 illustrates a noise predictor having only a single predictor coefficient.

Other decision feedback techniques have been used to correct for other kinds of channel-imposed distortion. For example, adaptive phase predictors correct for phase jitter using the history of actual phase errors reflected in the most recent decisions as an indication of phase distortion.

In using decision feedback techniques with conventional uncoded systems, decisions of which signal points were sent are available without delay. In coded systems, using DFE generally requires tentative decisions with no delay. Tentative decisions could be obtained from the most likely path history of the Viterbi algorithm, but such tentative decisions would not be reliable enough for feedback.

Use of the Viterbi algorithm as an optimum method of detecting a sequence of transmitted signals received over a noisy channel with intersymbol interference (ISI) in a conventional uncoded system is described in Forney, "Maximum-Likelihood Sequence Estimation of Digital Sequences in the Presence of Intersymbol Interference," IEEE Transactions on Information Theory, vol. IT-18, No. 3, May 1972. This application of the Viterbi algorithm is similar to detecting a sequence of signals transmitted by coded modulation in that in both cases dependencies between successive signal elements are introduced by a finite-state process. In coded modulation systems, the finite-state process is the encoder in the transmitter. In conventional uncoded systems with ISI, the ISI model of the channel (including transmit and receive filters) represents the finite-state process as explained in the Forney article. The state in the finite-state process is determined by the K most recent signal points, where K is the number of ISI terms in the channel model. Thus, assuming L bits are sent every signaling interval, the Viterbi algorithm will be based on $(2^L)^K$ possible states. In this application of the Viterbi algorithm, the branch metric computations will take into account the presence of ISI.

It is also possible to use the Viterbi algorithm as an optimum method for exploiting the noise correlation at the output of a linear equalizer. In terms of performance, this would be equivalent to the more conventional use described in the Forney article, provided the linear equalizer eliminates ISI. In this approach the Viterbi algorithm will again be based on $(2^L)^K$ states defined in the same manner, except branch metric computations are based on noise correlation rather than ISI.

In coded systems it is also possible to use the Viterbi algorithm for reducing the effects of channel distortion in an optimum manner, as described, for example, by A. Viterbi and J. Omura in "Principles of Digital Communication and Coding", McGraw Hill Book Company, 1979, incorporated herein by reference. In this approach the Viterbi algorithm will simultaneously provide decoding and channel equalization using a larger number of states than used in the encoder. Specifically, for each encoder state a new set of decoder states is defined in terms of K possible previous signal points such that with N encoder states a large number —$N(2^L)^K$— of decoder states is needed and a complicated implementation is required.

To summarize, in coded systems the combination of decision-feedback equalization and Viterbi detection is generally not directly available due to the decoding delay and to implementation complexity, respectively.

One scheme for using decision feedback with Viterbi algorithm decoding is disclosed in Qureshi, patent application U.S. Ser. No. 687,205, filed Dec. 28, 1984, assigned to the same assignee as this application, and incorporated herein by reference. In the Qureshi application, the receiver associates a separate decision-feedback noise predictor circuit with each possible state of the Viterbi decoder. The different predictor circuits use signal points in each state's path history for feedback to produce noise predictions as in a DFE. These noise predictions are used to offset the received signal to produce different modified versions. In extending the contending path histories from a current time interval to the next time interval, the Viterbi decoder uses these modified versions to compute branch metrics. Specifically, a branch metric for a transition from a given state is computed using the modified received signal based on noise prediction utilizing the signal points in that state's path history for decision-feedback.

More generally, in the Qureshi scheme the Viterbi decoder assumes the number of ISI terms in the channel model to be fewer than the actual number of ISI terms. In computing branch metrics the effect of longer ISI (or longer noise correlation) is compensated using decision-feedback independently for each state with decisions obtained from the path histories.

Some data transmission systems use so-called multi-dimensional encoding of digital symbols. A family of trellis coded multi-dimensional systems is disclosed in Wei, U.S. Ser. No. 727,398, filed on Apr. 25, 1985, assigned to the same assignee as this application, and incorporated herein by reference.

For example, a code for sending 7 bits per signaling interval could use a 32-state encoder which takes two intervals worth of bits (14 bits) at a time and maps them into two 2-dimensional (2D) signal constellations to obtain two 2D signal points transmitted in two successive signaling intervals. The received signals can be decoded with a Viterbi algorithm having 32-states where the path metrics and path histories are updated once every two signaling intervals based on 4D branch metrics. In multi-dimensional systems, the Viterbi algorithm can again be used to reduce the effects of channel distortion in an optimum manner. The Qureshi scheme, if applied to coded systems with a large number of states and/or with multi-dimensional encoding, would require a large number of branch metric computations and received signal modifications.

Unless indicated otherwise, in what follows we will use the term "signal points" to mean the transmitted symbols sent every signaling interval and the term "signal constellation" to mean the set of different possible signal points.

SUMMARY OF THE INVENTION

In one aspect, the general feature of the invention is a receiver that generates a plurality of modified versions of each received signal, and a decoder that decides which signal points were sent based on estimating a particular sequence of decoder states corresponding to a particular sequence of encoding states of a finite state process; the decoder stores a number of path histories and uses the modified versions to extend them to later signaling intervals, there being fewer modified versions than there are stored path histories.

In a second aspect, the general feature of the invention is in partitioning the signal point constellation into decision subsets and associating possible transitions from a decoder state with one of decision subsets based upon signal points stored in the path histories, and associating each modified version with one decision subset.

In a third aspect, the general feature of the invention is using fewer modified versions than the number of decoder states.

In a fourth aspect, the general feature of the invention is in using fewer decoder states than the number of decoder states in an optimum trellis decoder.

The preferred embodiments include the following features. The number of encoder states can be one (i.e., an uncoded system). In some embodiments, the finite state process is a coder in the transmitter that draws the signal points from encoder subsets of the signal point constellation and associates encoding state transitions with encoder subsets. In other embodiments, the finite state process is imposed by the distorting characteristics of the channel. The different modified versions are based on alternative decisions on the received signals. The alternative decisions are generated after no delay or after a delay of fewer time intervals than for final decisions. Each alternative decision is associated with a particular decision subset. The decision subsets are formed by partitioning the constellation. In some embodiments, the decision subsets are the same as the encoder subsets; in others, the decision subsets are not the same as the encoder subsets, for example they may be unions of the encoder subsets. The decision subsets may have a dimensionality larger than the dimensionality of the signal constellation. The alternative decisions are the signal points in the decision subsets that are closest to the most recent received signal. Each modified version is obtained by a noise predictor that offsets each received signal by a noise prediction value that is based on errors between prior received signals and corresponding alternative decisions. The time interval between successive encoding states may span a plurality of (e.g., 2) successive signaling intervals. The transmitter has a modulator and the receiver has a demodulator.

The number of path histories is greater than two. There may be four decision subsets and four modified versions. Decoder states are formed by combining encoder states with decision subsets. The decoder may make branch metric calculations successively with respect to each of the signal points spanned by the time interval.

The invention enables using better equalization techniques in coded systems by exploiting the noise correlation at the output of a linear equalizer. The invention can provide a simplification of the Qureshi scheme when the number of feedback coefficients is small. The invention also provides a new means for reducing the number of states in the optimum Viterbi algorithm when used to reduce the effects of channel distortion in systems with a large number of signal points. The decoder is simpler compared to prior art decoders because generally fewer branch metric computations and received signal modifications are needed. The additional decoder complexity relative to a conventional Viterbi decoder is generally independent of the number of states in the Viterbi algorithm and of the dimensionality of the encoder. The lower complexity of the decoder could allow its use with high-speed voiceband modems using a typical digital signal processor. The decoder can operate at a near-optimum performance at reduced complexity by taking into account the channel distortion in the decoding process. The actual performance advantage will depend upon the channel attenuation distortion, the coding system employed, and the complexity allowed at the receiver. In a typical application, a signal-to-noise ratio advantage of 0.5 to 1.5 dB can be obtained with noise predictors having just a single coefficient and using the same number of states in the decoder as in the encoder.

Other advantages and features will become apparent from the following description of the preferred embodiment and from the claims.

DESCRIPTION OF THE PREFERRED EMBODIMENT

We first briefly describe the drawings.

Drawings

FIG. 8 is a chart of 4D subsets, 2D subset pairs, and corresponding bit patterns.

FIG. 10 is a trellis chart.

FIG. 11 is a bit chart corresponding to the block encoder of FIG. 7.

STRUCTURE AND OPERATION

Figure 1:
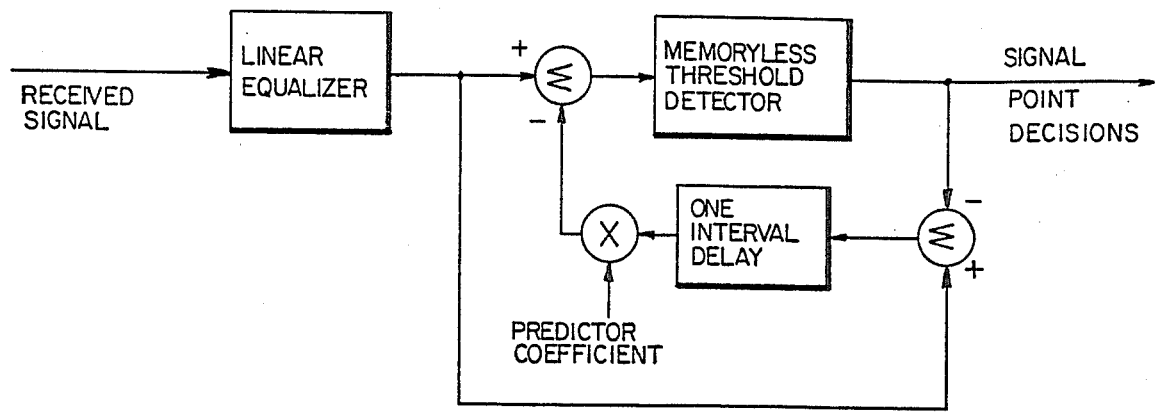
FIG. 1 is a block diagram of a receiver for use with an uncoded system and including a prior art noise predictor.
Figure 2:
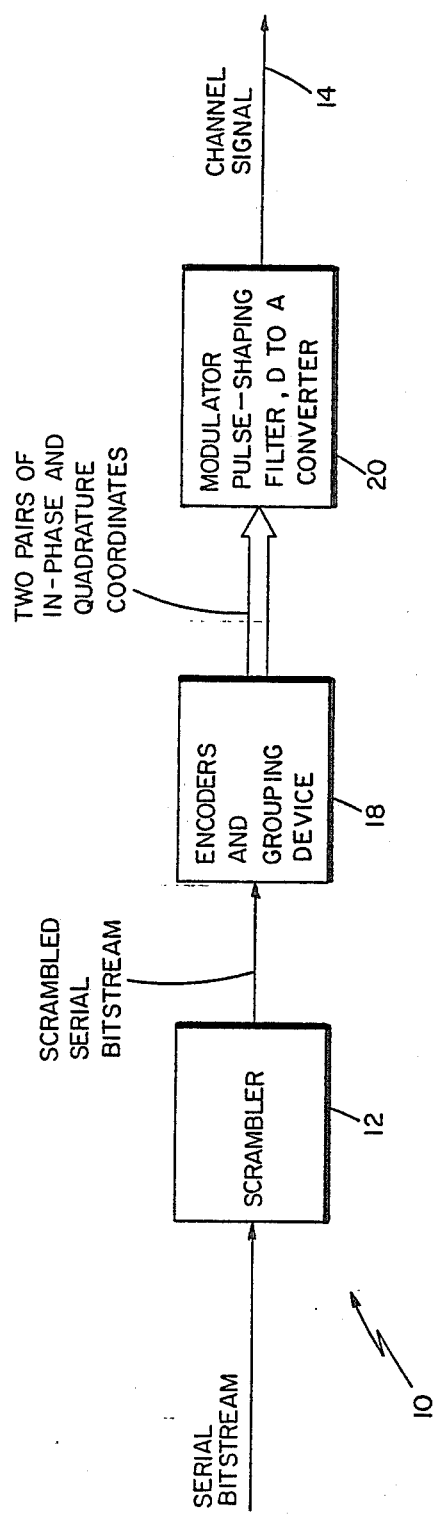
FIG. 2 is a block diagram of a transmitter of a 32-state, 4-dimensional coded modulated carrier communication system.

Referring to FIG. 2, in transmitter 10 a scrambler 12 receives a serial bit stream of information to be sent over a channel 14 at the rate of 7 bits per signaling interval. The 14 information bits that appear in each pair of successive signaling intervals, denoted as $I1_n$ through $I7_n$ for n=1, 2, are delivered to encoders and grouping device 18 which in turn delivers in series two pairs of in-phase and quadrature coordinates, each pair corresponding to a point in a two-dimensional (2D) signal constellation. In each signaling interval, modulator, pulse shaping filter, and D-to-A converter 20 modulates a carrier in accordance with the next pair of coordinates from encoders and grouping device 18 and delivers the modulated carrier channel signals to channel 14.

Figure 3:
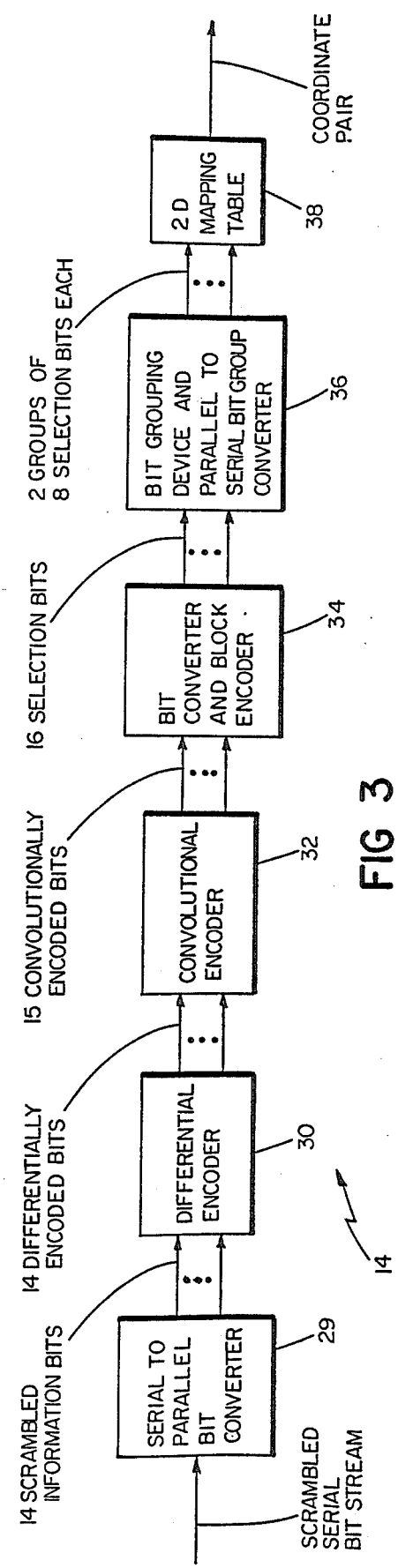
FIG. 3 is a block diagram of the encoders and selector of FIG. 2.

Referring to FIG. 3, encoders and grouping device 18 include a serial-to-parallel bit converter 29 which receives the serially appearing scrambled bits, organizes them into groups of information bits each having 14 bits and delivers each group to a differential encoder 30 which receives the information bits and differentially encodes some of them. The information bits including the differentially encoded ones are then passed through a finite state device in the form of a convolutional encoder 32 which convolutionally encodes some of the bits, adding one redundancy bit indicative of the current state of the finite state device represented by the convolutional encoder. The information bits including the differentially and convolutionally encoded bits are then passed through a bit converter and block encoder 34. The block encoder encodes some of the information bits and adds an additional bit. The bit converter reorganizes a set of the bits including the differentially and convolutionally encoded bits.

The output bits of the bit converter and block encoder 34 is a set of 16 point selection bits which are organized as the two groups $Z0_n$ through $Z7_n$, n=1, 2. Bit group device and parallel-to-serial bit group converter 36 then takes the groups one at a time and delivers them to 2D mapping table 38. For each combination of bits in a group, table 38 contains the corresponding pair of modulation coordinates which are then delivered to modulator 20 (FIG. 2).

Because the current state of the finite state device represented by the convolutional encoder depends both on its prior state and on the current information bits, the output bits of the convolutional encoder (and hence the transmitted signals) carry historical information about the information bits being sent. This historical information is exploited at the receiver end of channel 14.

Figure 4:
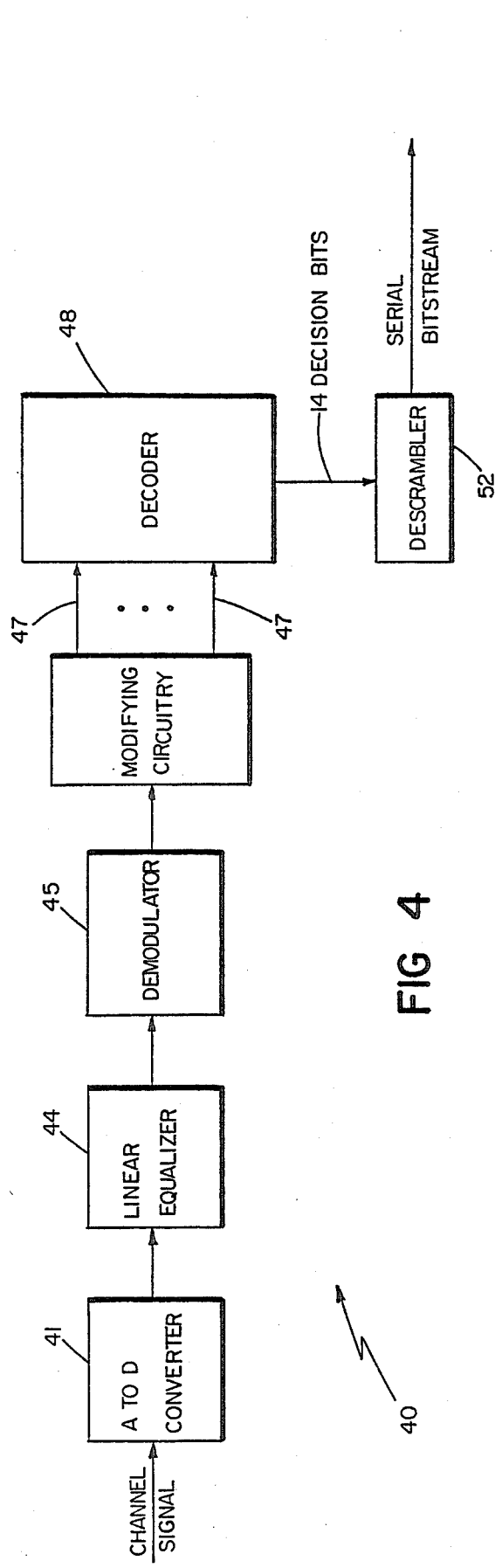
FIG. 4 is a block diagram of a receiver for use with the transmitter of FIG. 2.

Referring to FIG. 4, in receiver 40, the received modulated carrier channel signals are passed through an A-to-D converter 41, a linear equalizer 44, and a demodulator 45. Equalized and demodulated coordinate pairs are delivered serially from equalizer 44 to a modifying circuitry 46. Four modified versions of the received signals are then delivered respectively over four lines 47 to a decoder 48. Decoder 48 after a delay of several signaling intervals delivers final decision bits, for each group of 14 information bits which were sent, to a descrambler 52 to recover the original serial bitstream.

Figure 5:
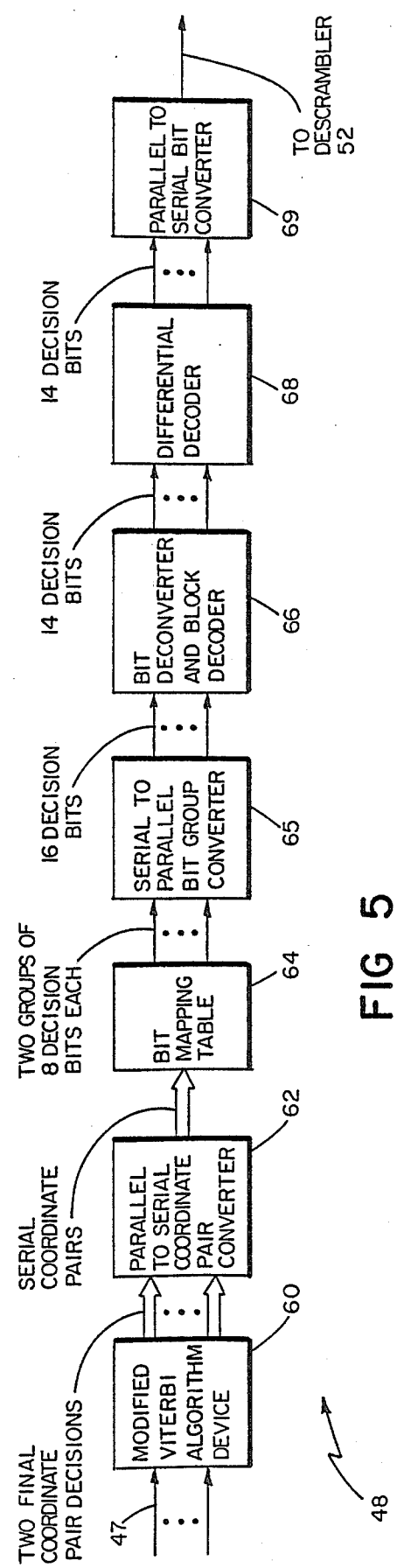
FIG. 5 is a block diagram of the decoder of FIG. 4.

Referring to FIG. 5, in decoder 48 the modified versions of the received signals are delivered to a modified Viterbi algorithm device 60 which after some delay delivers two final coordinate pair decisions. Parallel-to-serial coordinate pair converter 62 applies the coordinate pairs serially one pair at a time to a bit mapping table 64. For each coordinate pair applied to table 64, a corresponding group of eight decision bits is delivered to a serial-to-parallel bit group converter 65, then to a bit deconverter and block decoder 66, then to a differential decoder 68, and finally to a parallel-to-serial bit converter 69. The deconverter and decoder perform the reverse processes from the conversion and coding performed at the transmitter. The differential decoder then provides the estimates of the original groups of seven informations bits, $I1_n$ through $I7_n$, n=1, 2 via converter 69.

Returning again to the transmitter, the fourteen information bits which appear in two successive signaling intervals are encoded into two 2D signal points drawn from a 2D constellation having 192 points.

Figure 6:
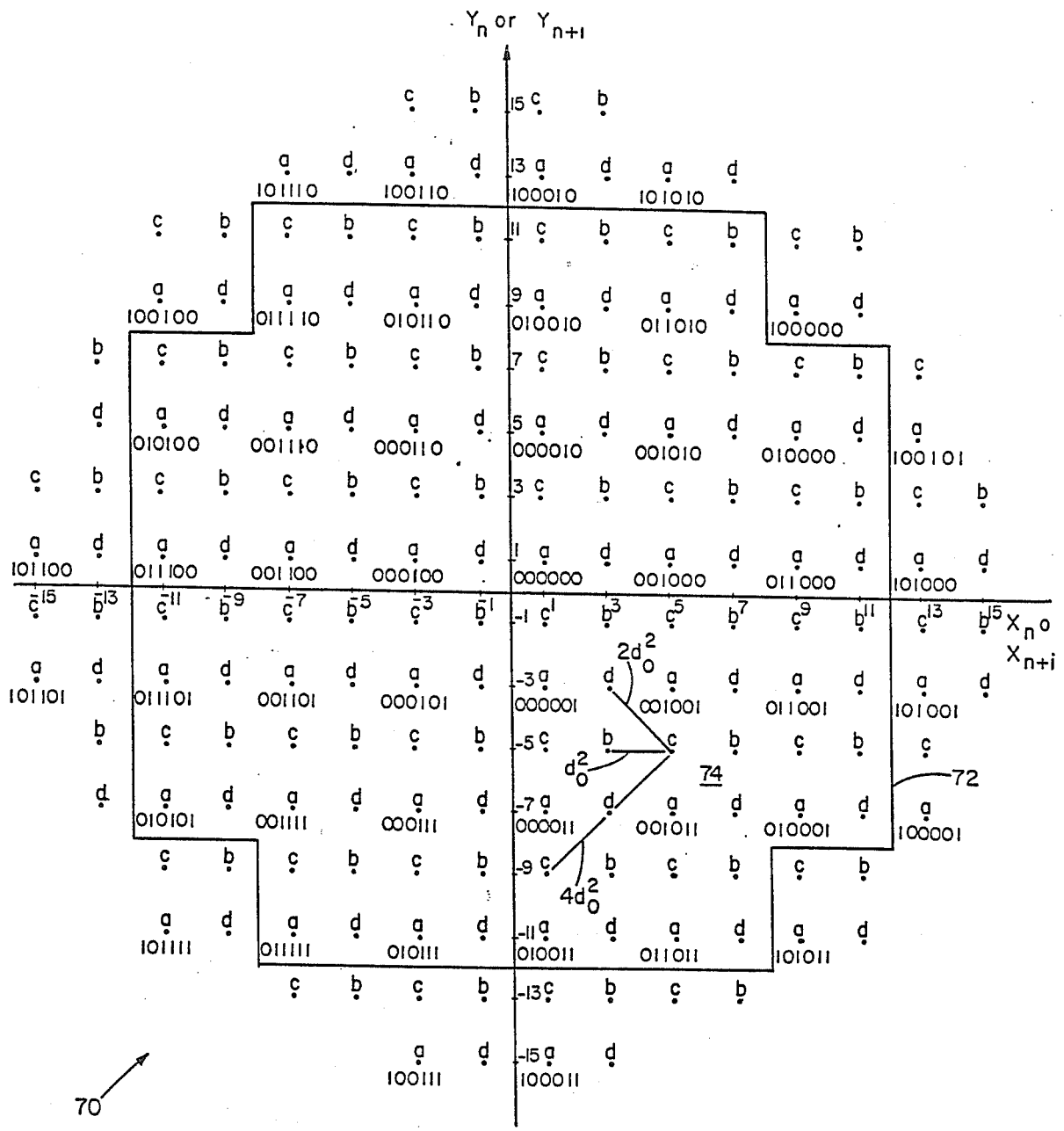
FIG. 6 is a diagram of a two-dimensional signal constellation for use with the transmitter of FIG. 2.

FIG. 6 shows how the 2D constellation 70 is constructed and partitioned. The 2D constellation includes the same 128-point cross constellation 72 (located within the boundary shown) which is typically used with an uncoded system for sending 7 bits per signaling interval. Those 128 points (indicated as dots) within the boundary are called inner group points. The 2D constellation also includes an outer group of 64 points, half as many points as are in the inner group. The outer group points are selected from the possible points lying on an extension of the inner group rectangular grid to regions beyond the boundary of the 128-point cross constellation. The outer group points are arranged as close to the origin as possible.

The 192-point 2D constellation is partitioned into four equal-sized subsets, denoted A, B, C, and D. In FIG. 6, the subset to which each point belongs is indicated by a lower case letter, a, b, c, or d. The subsets are grouped into two 2D families, denoted AUB (the union of A with B) and CUD. All subsets have the same numbers of inner group points and outer group points. The ratio of the number of outer group points to the number of inner group points in each subset is the same as the ratio for the entire 2D constellation. The minimum squared distance, $4d_0^2$, between points belonging to the same subset is greater than the minimum squared distance, $2d_0^2$, between points belonging to different subsets within the same 2D family, which is in turn greater than the minimum squared distance, $d_0^2$, between any two points. (Examples of such distances are shown with reference to point 74 on FIG. 6).

In the constellation of FIG. 6, some of the 2D points are labeled with a six-bit value representing the bit pattern $Z2_{n+i} Z3_{n+i} Z4_{n+i} Z5_{n+i} Z6_{n+i} Z7_{n+i}$ (i=0, 1). The same bit pattern is assigned to each of the four 2D points which can be obtained from each other by 90 degree rotations of the constellation.

Two identical such 2D constellations taken together can be conceived as a single 4D constellation having 36864 (=192×192) 4D points, the four coordinates of each 4D point being the same as the two pairs of coordinates of the corresponding pair of 2D points, one from each 2D constellation. Only 32768 (=$2^{15}$) of the 36864 4D points are used, namely the ones whose corresponding pair of 2D points do not both belong to the outer group. From now on, in discussing the 32-state code for transmitting 7 bits per signaling interval, we will refer to this 32768-point 4D constellation as the 4D constellation.

We now define 16 (=4×4) 4D subsets, each corresponding to a pair of 2D subsets, and denoted as (A,A), (A,B), . . . , and (D,D). Each 4D subset has 2048 points and the minimum squared distance between two 4D points belonging to the same subset is $4d_0^2$, which is the same as the minimum squared distance between two 2D points belonging to the same 2D subset. (The squared distance between two 4D points is simply the sum of the squared distances with respect to the two pairs of 2D points to which those two 4D points correspond). Note also that each 4D subset like the 4D constellation generally, contains only 4D points for which the corresponding pair of 2D points do not both belong to the outer group of the 2D subsets corresponding to that 4D subset.

The sixteen 4D subsets are grouped into two 4D families, denoted as 0U1U2U3U4U5U6U7 and 8U9U1-0U11U12U13U14U15. The minimum squared distance, $4d_0^2$, between 4D points belonging to the same 4D subset is greater than the minimum squared distance, $2d_0^2$, between 4D points belonging to different 4D subsets within the same 4D family, which is in turn greater than the minimum squared distance, $d_0^2$, between any two 4D points.

Figure 7:
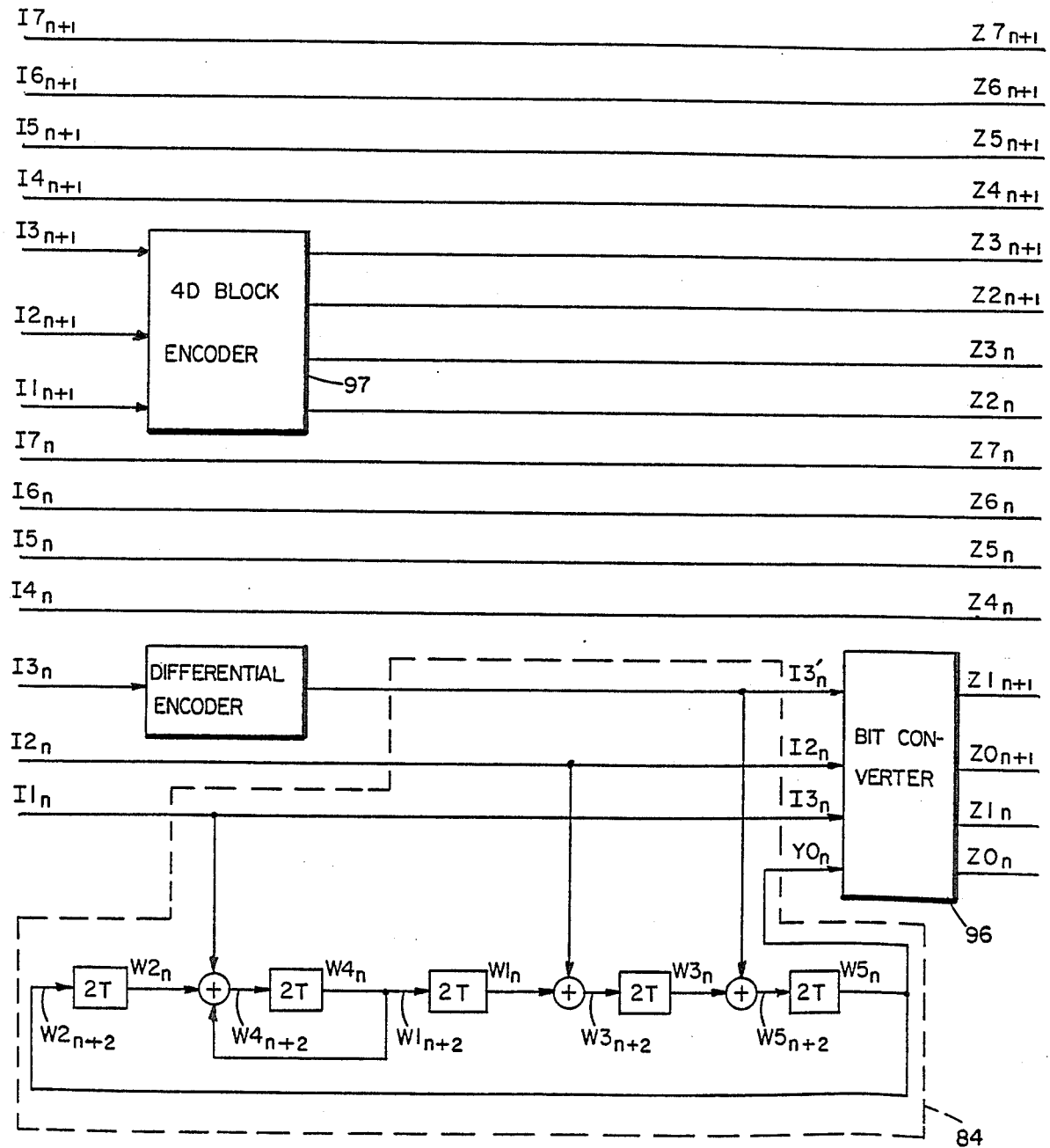
FIG. 7 is a block diagram of the encoders and bit converter of FIG. 3.

The design of a 32-state, 180 degree rotationally invariant linear convolutional code with these sixteen 4D subsets is illustrated in FIGS. 7 and 8. A rate ¾, 32-state linear convolutional encoder 84 is used to generate four bits ($Y0_n I1_n I2_n I3_n'$) needed to specify the 4D subset from which a 4D point is to be drawn. (Note that the bit patterns in the $Y0_n I1_n I2_n I3_n'$ columns of FIG. 8 correspond to the decimal number for each 4D subset.)

In convolutional encoder 84, each box marked 2T represents a temporary storage element which holds any input value for two signaling intervals; the value held in the element always appears at its output. The circles marked plus are "exclusive or elements". The outputs of the 2T elements are bits marked $W1_n$, $W2_n$, $W3_n$, $W4_n$, and $W5_n$ which together comprise the state of the finite state device represented by encoder 84.

Figure 9:
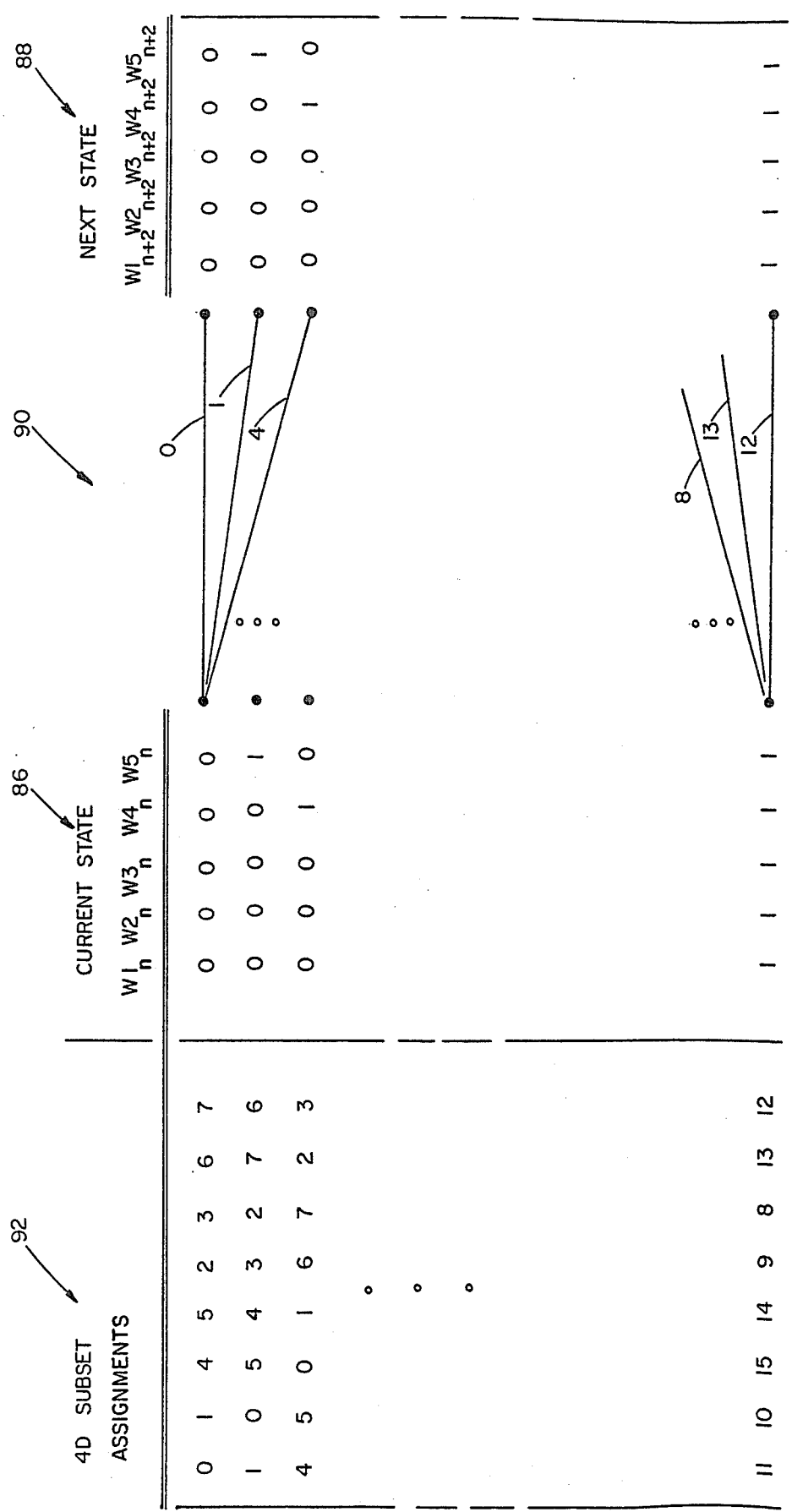
FIG. 9 is a representative portion of a trellis diagram.

Only certain sequences of state transitions of the convolutional encoder are allowed as represented by the branches in the trellis diagram of FIG. 9. In FIG. 9, the 32 possible current states are represented by a column of dots 86 each marked with the corresponding pattern of state defining bits. The 32 possible next states are represented by column 88. Trellis branches 90 connecting current states to next states represent allowed state transitions (Only representative portions of the trellis are shown in FIG. 9. The entire trellis can be reconstructed from the chart of FIG. 10). Each state can be followed by only eight possible transitions. Each transition has a 4D subset assigned to it. The assignment for transitions from each current state are represented by the 4D subset numbers appearing in column 92 to the left of that state. For example, the eight transitions from current state 00000 are assigned 4D subsets 01452367 respectively, as shown in FIG. 10. Only the first three transitions are labeled in FIG. 9.

We now describe how to map the four output bits of the convolutional encoder and the eleven remaining uncoded information bits into the 4D constellation. Four coordinate values are needed to define each 4D point. A table of 96 (=48×2) 2D coordinate values is used twice to look up the four needed coordinate values. The table being referred to can be constructed from the constellation of FIG. 6 simply by associating with the coordinates of each point the eight bits needed to represent the point, namely, the six bits marked under the point and the two bits needed to specify its 2D subset. For example, for point 74 the coordinates 5,5 are associated in the table with the eight Z bits 10001010.

Referring again to FIGS. 7 and 8, after using the four output bits of the convolutional encoder to specify a 4D subset, a bit converter 96 converts the four bits (Y0$_n$, I1$_n$, I2$_n$, I3$_n'$) into two pairs of selection bits, Z0$_n$ Z1$_n$, and Z0$_{n+1}$ Z1$_{n+1}$, which are used to select the pair of 2D subsets corresponding to the 4D subset. In the constellation of FIG. 6, each pair of selection bits corresponds in a 2D subset in accordance with the following table:

| 2D Subset | Z0$_n$ Z1$_n$ or Z0$_{n+1}$ Z1$_{n+1}$ |
|---|---|
| A | 00 |
| B | 01 |
| C | 10 |
| D | 11 |

The eleven uncoded information bits which remain are used to select a particular 4D point from the previously selected 4D subset.

Referring to FIGS. 7 and 11, a 4D block encoder 97 takes three of the remaining uncoded information bits (I1$_{n+1}$, I2$_{n+1}$, I3$_{n+1}$) and generates two pairs of selection bits (Z2$_n$ Z3$_n$ and Z2$_{n+1}$ Z3$_{n+1}$). Each pair of those selection bits can assume any of the values 00, 01, or 10, but they cannot both assume the value 10. The first pair Z2$_n$ Z3$_n$ will be used to select the inner group or outer group of the first 2D subset corresponding to the previously selected 4D subset, likewise for the second pair Z2$_{n+1}$ Z3$_{n+1}$ with respect to the second 2D subset. The inner group is organized into two halves. If the pair of selection bits is 00, one of the halves of the inner group is selected; if the bits are 01, the other half of the inner group is selected; otherwise the outer group is selected.

There are sixteen 2D points in the outer group or in either half of the inner group of a 2D subset, and eight uncoded information bits remain for selecting from among those 2D points. Those eight bits are taken in two groups of four bits each, and are renamed as Z4$_n$ Z5$_n$ Z6$_n$ Z7$_n$ and Z4$_{n+1}$ Z5$_{n+1}$ Z6$_{n+1}$ Z7$_{n+1}$. The first group Z4$_n$ Z5$_n$ Z6$_n$ Z7$_n$ will be used to select a 2D point from the previously selected outer group or the selected half of the inner group of the first 2D subset, and likewise for the second group Z4$_{n+1}$ Z5$_{n+1}$ Z6$_{n+1}$ Z7$_{n+1}$.

To summarize, the bit converter 96 and 4D block encoder 97 take the four output bits of the convolutional encoder and the eleven remaining uncoded information bits and produce sixteen coded selection bits. Those sixteen selection bits are then grouped by sampler 36 into two groups of eight selection bits each, Z2$_n$ Z3$_n$ Z4$_n$ Z5$_n$ Z6$_n$ Z7$_n$ Z0$_n$ Z1$_n$ and Z2$_{n+1}$ Z3$_{n+1}$ Z4$_{n+1}$ Z5$_{n+1}$ Z6$_{n+1}$ Z7$_{n+1}$ Z0$_{n+1}$ Z1$_{n+1}$. The first group Z2$_n$ Z3$_n$ Z4$_n$ Z5$_n$ Z6$_n$ Z7$_n$ Z0$_n$ Z1$_n$ is then used to address a 2D mapping table 38 (constructed in the manner previously described) to obtain the pair of coordinates for the first 2D point corresponding to the 4D point defined by the four output bits of the convolutional encoder and the eleven remaining uncoded information bits. Likewise, the second group of selection bits addresses the same table 38 to obtain the coordinates of the second 2D point. Since each group of eight selection bits Z2$_m$ Z3$_m$ Z4$_m$ Z5$_m$ Z6$_m$ Z7$_m$ Z0$_m$ Z1$_m$, when m=n or n+1, can assume only 192 values (because Z2$_m$ Z3$_m$ cannot be 11), the table has only 384 (=192×2) coordinate values. The table can be further reduced to only 96 (=48×2) coordinate values, if we also require that the same pattern of Z2$_m$ Z3$_m$ Z4$_m$ Z5$_m$ Z6$_m$ Z7$_m$, for either m=n or n+1, be associated with each of the four 2D points which can be obtained from each other by 90 degree rotations. In that case, the table provides the pair of coordinate values corresponding to Z2$_m$ Z3$_m$ Z4$_m$ Z5$_m$ Z6$_m$ Z7$_m$ for a specific pattern of Z0$_m$ Z1$_m$, m=n or n+1. The pair of coordinate values corresponding to other patterns of Z0$_m$ Z1$_m$ can be obtained through 90 degree rotations of the pair of coordinates obtained for the specific pattern of Z0$_m$ Z1$_m$.

In effect, the sequence of signal points sent from encoder 26 carries with it information (in the form of the subsets from which those signal points were drawn) about the encoder's path through the trellis.

At the receiver, decoder 48 exploits this historical information to estimate the path through the trellis which was likely to have been traversed at the transmitter by also taking into account the noise correlation, and using that estimated path determines the signal points which were sent. The decoding process is based on a modification of the Viterbi decoding algorithm.

As of each point in time represented in the trellis (e.g., the time represented by column 86 of FIG. 9) the decoder stores for each of the possible thirty-two states a contending path history comprising the list of the L most recent 4D signal points lying on some likely trellis path which ends in that state. (2L is the number of signaling intervals—for example—which elapses between the time a signal is received and the time a corresponding final decision is made about which signal point was sent). The decoder also stores for each possible state a contending path metric which represents the aggregate squared distance between the 4D signal points on the contending path ending in that state and certain noise corrected versions (to be described below) of the sequence of received 4D signals.

After two more signaling intervals have elapsed, the decoder extends the trellis to the next point in time along the trellis (e.g., the time represented by column 88 in FIG. 9). Extending the trellis is done in general by identifying the minimum metric contending trellis path ending in each next possible state based on the previously stored contending path metrics and on calculations of the squared distances (branch metrics) for alternative possible transitions (branches) leading to each next possible state. Once the trellis has been extended, the oldest 4D signal point in the most likely one of the contending path histories becomes a final decision. This process of extending the trellis is repeated every two signaling intervals.

Figure 12:
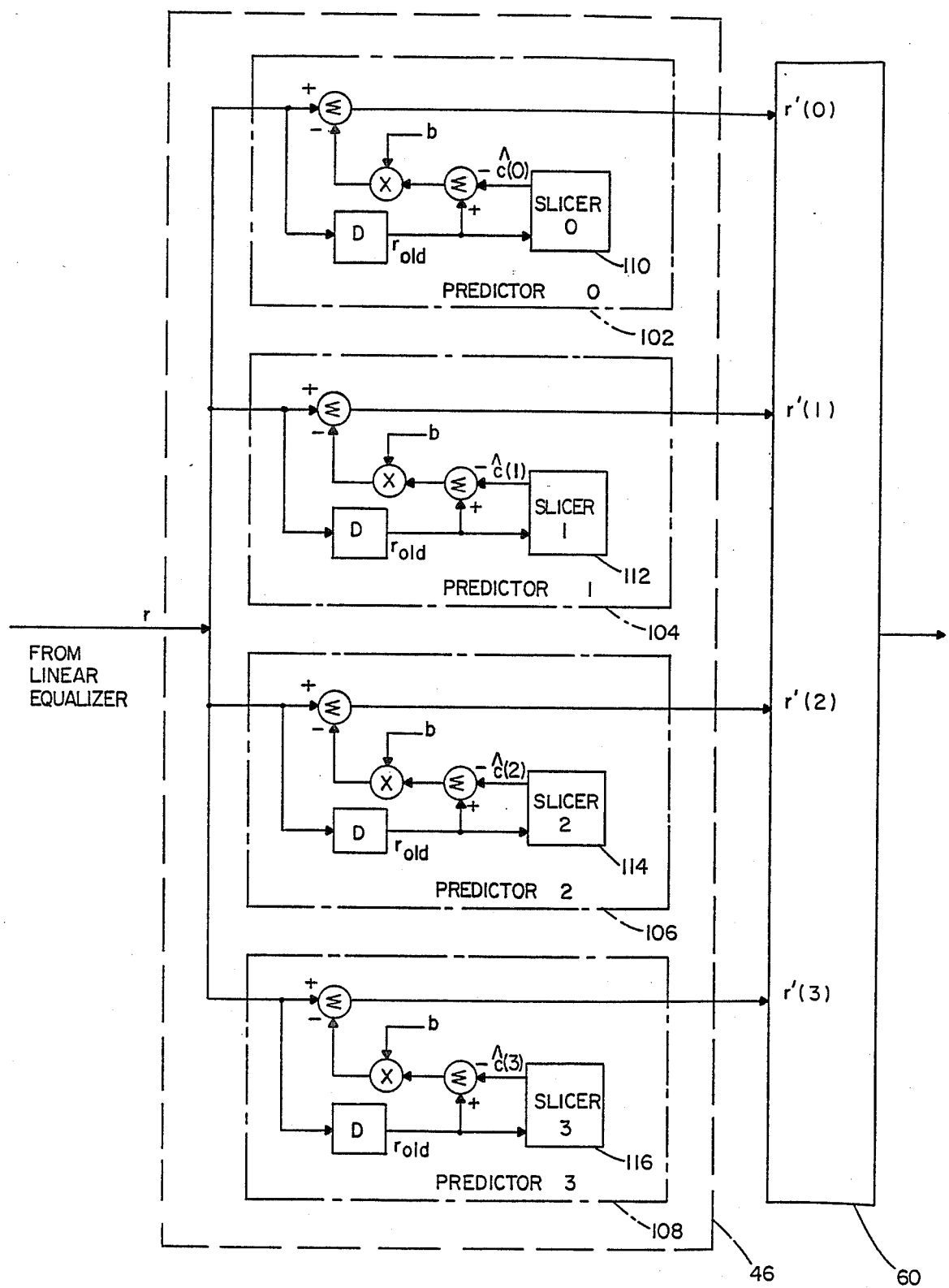
FIG. 12 is a block diagram of the noise prediction circuitry and decoder of FIG. 4.

More specifically, referring to FIG. 12, modifying circuitry 46 includes four noise predictors 102, 104, 106, 108, associated respectively with the four different 2D subsets A, B, C, D. For example, predictor 104 is associated with 2D subset B. In what follows we represent 2D subsets by integers according to:

A~0

B~1

C~2

D—3.

Although in this example the subsets associated with the predictors are the same as the subsets used in the encoder, in general the subsets used with the predictors can be different and thus will be called decision subsets while the subsets at the encoder will be called encoder subsets.

Modifying circuitry 46 receives from the demodulator pairs of 2D received signals each pair corresponding to two intervals worth of bits encoded by the transmitter. The two received signals in each pair are delivered in sequence. The currently received pair are respectively denoted $r_{1,\,new}$ and $r_{2,\,new}$, while the previous pair are denoted $r_{1,\,old}$ and $r_{2,\,old}$. Thus, the order in which the signals are delivered is $r_{1,\,old}$, $r_{2,\,old}$, $r_{1,\,new}$, $r_{2,\,new}$. The same received signals are delivered to all of the predictors.

In all of the predictors, the same predictor coefficient is used for both received signals of the currently received pair and is denoted $b_{new}$. For the prior pair of received signals the coefficient is $b_{old}$. The modified received signals delivered from the predictors are denoted by "prime" signs: In the first signaling interval they are denoted $r'_{1,\,new}(i)$, $i=0, 1, 2, 3$; in the second signaling interval $r'_{2,\,new}(i)$, $i=0, 1, 2, 3$. The noise predictions used in the first and second intervals are respectively denoted $\hat{n}_1(i)$, $\hat{n}_2(i)$, $i=0, 1, 2, 3$. The tentative decisions of which signals were sent in the current pair of intervals are respectively denoted $\hat{C}_{1,\,new}$, $\hat{C}_{2,\,new}$ and the tentative decisions for the prior pair of intervals are $\hat{C}_{1,\,old}$, $\hat{C}_{2,\,old}$. These decisions will be used in updating the predictor coefficient. The closest signal points from each of the 2D decision subsets to the received signals are determined by slicers 110, 112, 114, 116 and are denoted $\hat{C}_{1,\,new}(i)$, $\hat{C}_{2,\,new}(i)$, $\hat{C}_{1,\,old}(i)$, $\hat{C}_{2,\,old}(i)$, $i=0, 1, 2, 3$. These alternative decisions will be used by the predictors to form the input error signals as described below.

Figure 13:
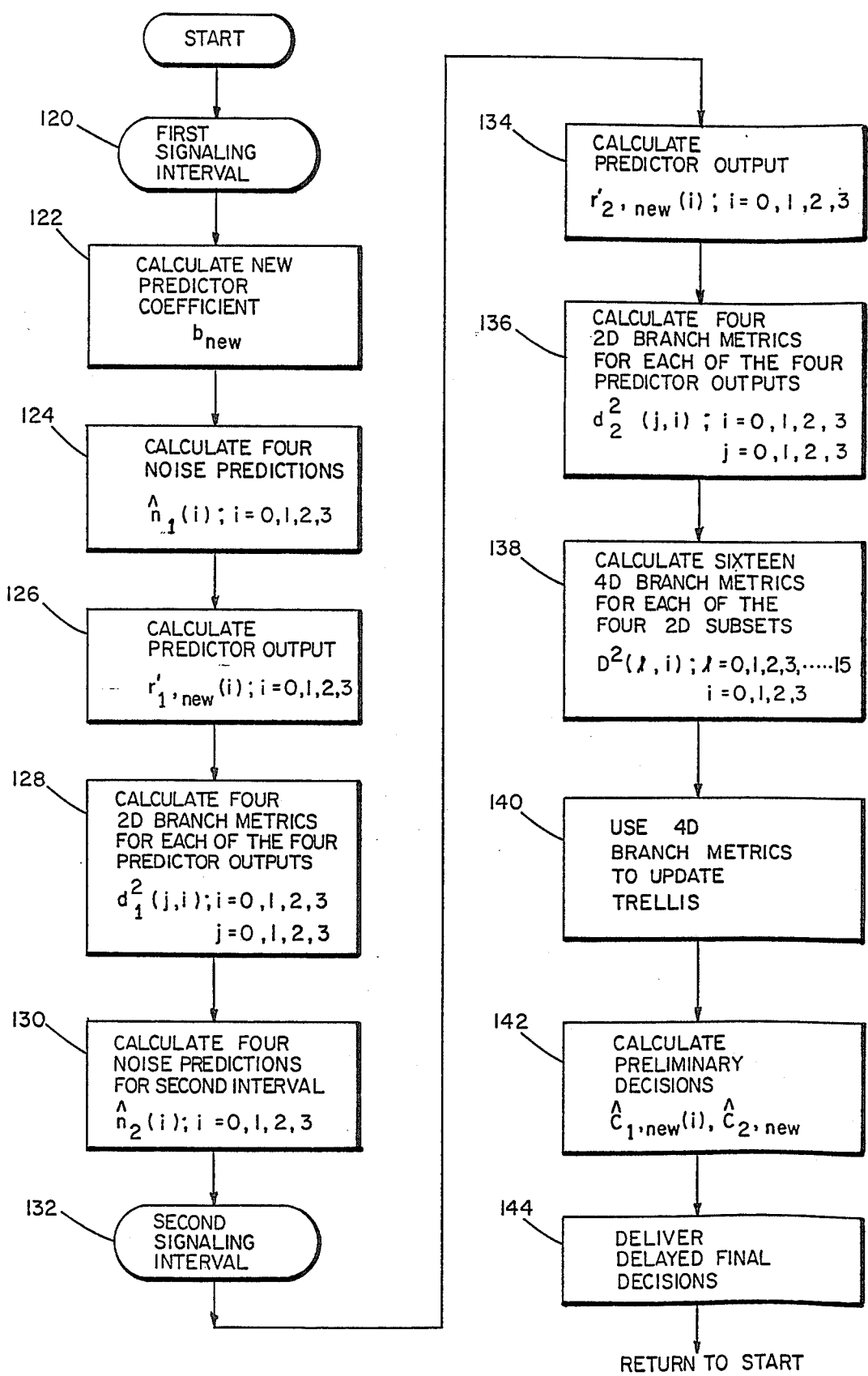
FIG. 13 is a flow chart of the decoding process.

Referring to FIG. 13, the decoding for each pair of signaling intervals proceeds on an interval-by-interval basis. In the first interval of the pair (120), the first step is to update the predictor coefficient ($b_{new}$) to be used by all four predictors in both intervals of the pair (122).

$$b_{new} = b_{old} - \Delta(r_{2,\,old} - (r_{1,\,old} - \hat{C}_{1,\,old})b_{old} - \hat{C}_{2,\,old})(r_{1,\,old} - \hat{C}_{1,\,old})^*.$$

where * represents the complex conjugate and $\Delta$ is a positive constant. $\hat{C}_{1,\,old}$ and $\hat{C}_{2,\,old}$ are the tentative decisions in the prior signaling intervals corresponding to the most recent signal points in the best path history with the minimum path metric.

The next step is to compute a noise prediction for each of the four predictors (124) based respectively on the points in the previous signaling interval ($\hat{C}_{2,\,old}(i)$ from each 2D decision subset ($i=0, 1, 2, 3$)) which are closest to the corresponding non-modified received signal in that interval:

$$\hat{n}_1(i) = (r_{2,\,old} - \hat{C}_{2,\,old}(i))b_{new},\ i=0, 1, 2, 3.$$

Next, each predictor uses its noise prediction to modify (126) the currently received signal $r_{1,\,new}$. The outputs of the modifying circuitry are then:

$$r'_{1,\,new}(i) = r_{1,\,new} - \hat{n}_1(i),\ i=0, 1, 2, 3.$$

Then, four 2D branch metrics are computed (128) for each modified received signal, namely the branch metrics for the signal points in the four 2D encoder subsets which are nearest to that modified point. A total of sixteen 2D branch metrics are thus calculated: $d_1^2(j,i)$, $i=0, 1, 2, 3$, $j=0, 1, 2, 3$, where $d_1^2(j,i)$ is the squared distance between the modified received signal $r'_{1,\,new}(i)$ and the nearest signal point from the jth 2D encoder subset. The 16 branch metrics are saved.

Next, the closest points in each 2D decision subset —$\hat{C}_{1,\,new}(i)$— to the non-modified received signal $r_{1,\,new}$ are found and new noise predictions are computed (130) for use in the second signaling interval:

$$\hat{n}_2(i) = (r_{1,\,new} - \hat{C}_{1,\,new}(i))b_{new},\ i=0, 1, 2, 3.$$

In the second signaling interval (132), those noise predictions are used to modify the received signal (134). The outputs of the four modifying circuitry are then:

$$r'_{2,\,new}(i) = r_{2,\,new} - \hat{n}_2(i),\ i=0, 1, 2, 3.$$

Next, for each modified received point, four 2D branch metrics are computed, $d_2^2(j,i)$, $i=0, 1, 2, 3$, $j=0, 1, 2, 3$, where $d_2^2(j,i)$ is the squared distance between the modified received signal $r'_{2,\,new}(i)$ and the nearest 2D signal point in the jth 2D encoder subset (136). These sixteen branch metrics are saved.

The 2D branch metrics saved in the first and second intervals are then combined (138) into a total of 64 4D branch metrics. Each 4D branch metric is the sum of one of the first interval 2D branch metrics and one of the second interval 2D branch metrics. Each of the 64 4D branch metrics is denoted $$D^2(l,\,i) = d_1^2(j,\,i) + d_2^2(k,\,j),$$

$l=0, 1, \ldots, 15$
$i=0, 1, 2, 3.$ where l represents the 4D subset corresponding to the 2D encoder subsets j and k. For example, the 4D branch metric $D^2(l,i)$ is the sum of (a) the squared distance between the first interval output of the ith modifying circuitry, and the nearest 2D point from the first 2D encoder subset j corresponding to the lth 4D subset, plus (b) the squared distance between the second interval output of the modifying circuitry associated with the first 2D decision subset j corresponding to the lth 4D subset, and the nearest 2D point form the second 2D encoder subset k corresponding to the lth 4D subset. Restated, the 4D branch metric is a concatenation of two 2D branch metrics for the two signaling intervals. The 2D metrics are respectively based on the closest points from the two 2D encoder subsets making up the 4D subset. In the first interval the metric is measured from some i'th modified received signal; in the second interval from the modified received signal associated with the 2D decision subset of the first interval.

The 64 4D branch metrics are then used to extend the trellis (140) by first assigning to each trellis branch an appropriate one of the 4D branch metrics. Specifically, a trellis branch to which a 4D subset l has been assigned and which originates from a state with a path history whose most recent 2D signal point is in 2D decision subset i will be assigned branch metrics $D^2(l,i)$. Once the branch metrics have been assigned, the extension of the trellis is accomplished in the usual way by finding the best contending paths with minimum accumulated metric ending in each possible next state.

Next, the best contending trellis path is identified. The most recent 4D signal point $\hat{C}_{1,\,new}\hat{C}_{2,\,new}$ in that path is saved to be used to update the predictor coefficient in the next signaling interval. The oldest 4D signal point in that path is released (144) as a final decision for delivery to converter 62 (FIG. 5).

Because of the simplification in the 4D constellation mapping, the mapping from each finally decided 4D point back to the 14 information bits in the decoder is simplified. Each 2D point of the pair of 2D points corresponding to the 4D point can first be mapped back to eight Z bits, using a single bit mapping table 64 (FIG. 4). Then performing the inverse conversions corresponding to the bit converter and 4D block encoder produces the 14 information bits.

Thus, the number of noise predictors is not dependent on the number of states or the number of dimensions of the code. Only 16 possible branch metrics need to be calculated in each signaling interval, and only 64 4D metrics need to be calculated. With relatively few branch metric and noise prediction calculations to be made, the decoder can be relatively simple with no major sacrifice in performance.

Other embodiments are within the following claims.

The code can be other than 4D, for example 2D, 8D, 16D, etc., and can have other numbers of states, for example, 8 states, 16 states, 64 states, etc. The noise predictors can be replaced by or combined with other feedback devices such as adaptive phase predictors. A baseband communication system can be used.

In generating modified versions of the received signal, the modifying circuitry may use a finer or coarser partitioning of the 2D signal constellation than the partitioning used in the encoder. For example, in the 32-state code, the modifying circuitry may partition the 192-point 2D signal constellation into 8 decision subsets with 24 points in each decision subset, again keeping the distance between points in a decision subset as large as possible. In this case, 8 noise predictions and 8 modified versions of the received signal will be generated. For each modified version, 4 2D branch metrics are computed with respect to each of the 2D encoder subsets A, B, C, and D. The 32 branch metrics computed in each signaling interval are combined to obtain 128 4D branch metrics $D^2(l, i)$, $l=0, 1, \ldots, 15$, $i=0, 1, \ldots, 7$. A trellis branch to which a 4D subset l has been assigned and which originates from a state with a path history whose most recent 2D signal point is in the 2D decision subset i (0–7) will be assigned the branch metrics $D^2(l, i)$. Otherwise, the decoding proceeds in the same manner as described above.

The scheme can also be used with multiple predictor coefficients. In this case, the decision subsets will be multi-dimensional. For example, in the 32-state code, to use two predictor coefficients, we can choose the 16 4D encoder subsets as the decision subsets. Then, each signaling interval, 16 4D alternative decisions are formed. For example in the first signaling interval, the modifying circuitry first forms 4 2D alternative decisions $\hat{C}_{1,\,new}(i)$, $i=0, 1, 2, 3$ as before, by choosing the signal points in each of the 2D subsets $i=0, 1, 2, 3$ closest to the non-modified received signal $r_{1,\,new}$. These are then combined with the 4 2D alternative decisions $\hat{C}_{2,\,old}(j)$, $j=0, 1, 2, 3$ from the previous signaling interval (computed in the same manner) to form the sixteen 4D alternative decisions $(\hat{C}_{1,\,new}(i), \hat{C}_{2,\,old}(j))$, $i, j=0, 1, 2, 3$.

For each 4D alternative decision a different noise prediction value $\hat{n}_2(l)$, $l=0, 1, \ldots 15$ is generated for use in the second signaling interval:

$$\hat{n}_2(l) = (r_{1,\,new} - \hat{C}_{1,\,new}(i))b_{1,\,new} + (r_{2,\,old} - \hat{C}_{2,\,old}(j))b_{2,\,new},$$

$l = 0, 1, \ldots 15$
$i, j = 0, 1, 2, 3,$ where $l=(i, j)$ represents the 4D decision subset associated with 2D subsets j and i. The quantities $b_{1,\,new}$ and $b_{2,\,new}$ are the first and second order predictor coefficients, respectively. These can be updated adaptively in a manner similar to the updating of the coefficient $b_{new}$ described before for the single-coefficient predictor. In the second signaling interval, 16 modified versions $r'_{2,\,new}(l)$, $l=0, 1, \ldots, 15$ of the received signal $r_{2,\,new}$ will be formed:

$$r'_{2,\,new}(l) = r_{2,\,new} - \hat{n}_2(l),$$

$l = 0, 1, \ldots, 15.$

For each modified version, 4 2D branch metrics are computed with respect to 4 2D encoder subsets A, B, C and D, the resulting 64 branch metrics are then used together with the 64 branch metrics from the first signaling interval (computed in the same manner) to obtain 256 4D branch metrics $D^2(i, l)$, $i=0, 1, \ldots, 15$, $l=0, 1, \ldots, 15$. A trellis branch to which a 4D subset i has been assigned and which originates from a state with a path history whose most recent pair of signal points is in the 4D decision subset l (0–15) will be assigned the branch metrics $D^2(l, i)$. The trellis update can otherwise proceed in the same manner as described before. Again the decision subsets can be different from the encoder subsets. For example in principle, only 8 decision subsets need be used.

Figure 14:
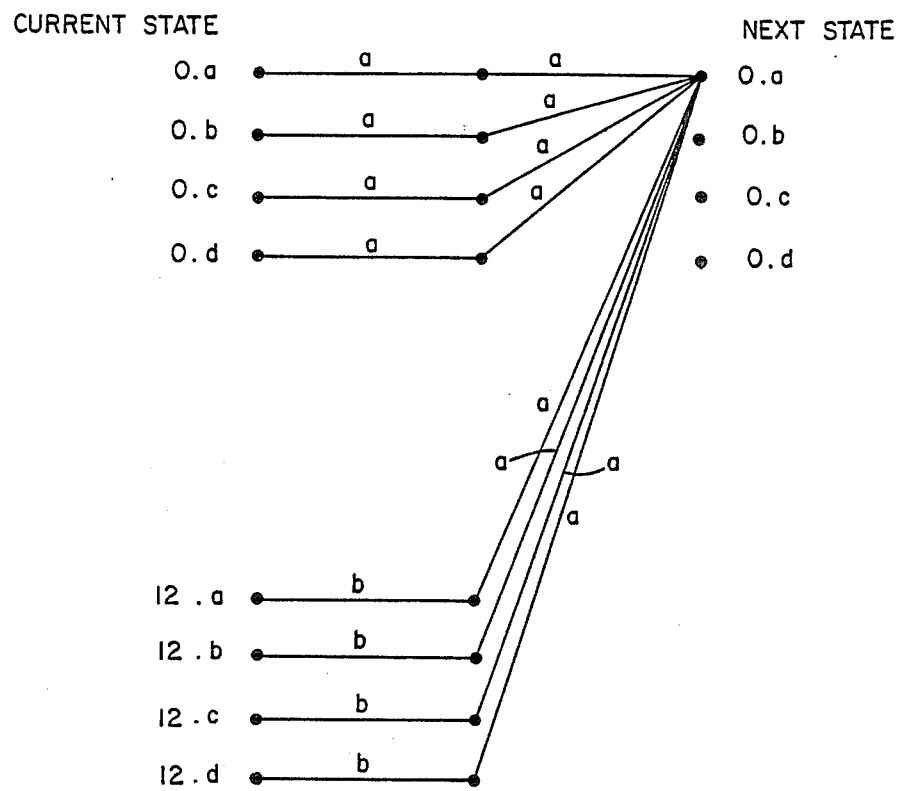
FIG. 14 is a representative portion of a trellis diagram.

The decoder may employ a larger number of states than required by the encoder, to achieve improved performance. For example, for the single-coefficient case, in the 32-state 4D decoder each current encoder state can be replaced by 4 new decoder states based on the most recent 2D decision subsets. More specifically, when the decision subsets are the same as the 2D encoder subsets, the new decoder states can be denoted as (i, a), (i, b), (i, c) and (i, d), where i (0–31) represents the encoder state and a, b, c, or d represent the 2D decision subset associated with the most recent signal point in a trellis path. Thus, there will be 128 (=32×4) decoder states with 8 transitions (branches) from each decoder state. The state transition diagram for this new decoder state assignment can be easily obtained from FIG. 10. In general, the state (k, j) with k (0–31) being an encoder state and j (a, b, c, or d) a 2D decision subset will have transitions from decoder states (n, a), (n, b), (n, c), (n, d) and (m, a), (m, b), (m, c) (m, d) with n and m representing the two decoder states which have a transition to encoder state k corresponding to a 4D subset the second 2D subset of which is j. For example, the transitions to state (0, a) will be as shown in FIG. 14. In the decoding process 128 contending path metrics and path histories will be stored. The generation of the four modified versions of the received signal and the calculation of 64 4D branch metrics will be the same. The trellis update can proceed in a similar manner. For example, the new path metric for state (0, a) will be the minimum accumulated path metric of all contending paths shown in FIG. 14 leading to state (0, a). The tentative decisions $\hat{C}_{1,\,new}$ and $\hat{C}_{2, new}$ and the final decisions are again obtained from the best path history with the smallest path metric.

The described decoder has a reduced number of states relative to an optimum Viterbi decoder (optimum for combined decoding/equalization) becuase the states are defined in terms of subsets of signal points rather than in terms of the individual signal points. Note that for the single-coefficient case the optimum decoder would need 6144 (=32×192) decoder states and substantially more complicated branch metric computations. The set partitioning used in the decoder can again be different from the partitioning use in the encoder. In the special case when the number of decision subsets is equal to the number of signal points, the decoder will become optimum for the single-coefficient case. By using a moderate number of decision subsets, near-optimum performance can be obtained with significantly less complexity than required by the optimum decoder. The method can be applied for codes with any number of states or dimensions. It can also be used in conjunction with the Qureshi scheme, by modifying received signals with alternative decisions taken directly from path histories or previous branch metric computations. Multiple predictor coefficients can be handled by defining states in terms of multi-dimensional decision subsets.

Figure 15:
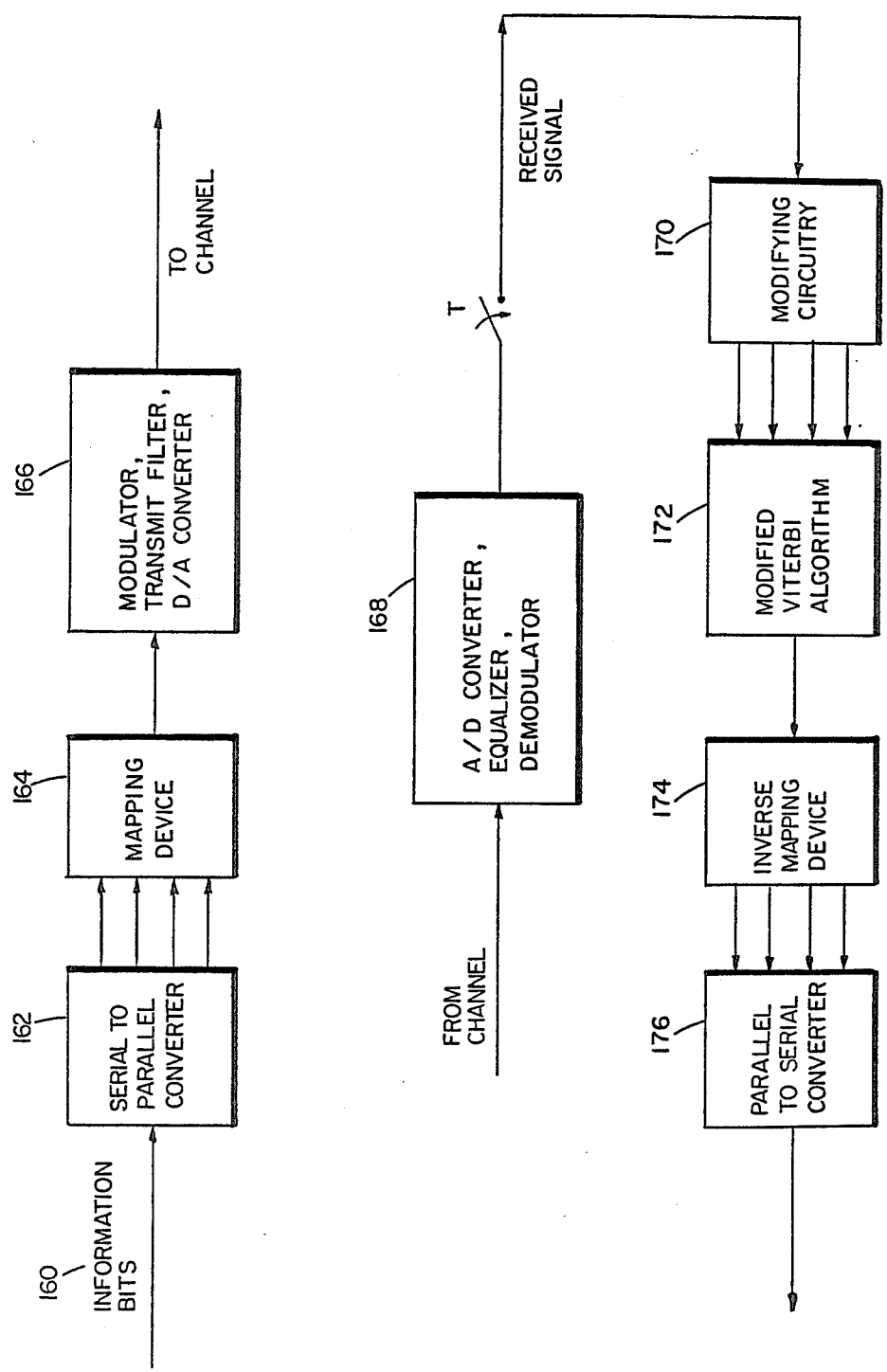
FIG. 15 is a block diagram of a 16-QAM system employing the simplified Viterbi decoder.

This method can also be used to implement a reduced-state Viterbi algorithm detector in an uncoded system with channel distortion. Referring to FIG. 15, in an uncoded 16-QAM communication system, a stream of binary digits 160 are collected in groups of four by serial-to-parallel converter 162 and encoded in the mapping device 164 at the signaling rate into a complex signal point according to the signal point mapping shown in FIG. 16. The signal points are modulated, filtered in a transmit filter and D/A converter 166 to generate an analog signal to be sent over a bandlimited, noise-affected channel.

In the receiver, the noise-affected signal is A/D converted and passed through a linear equalizer 168 to generate a sequence of received signals at the signaling rate. The equalizer suppresses any ISI introduced by the channel, but its output is corrupted by a noise sequence which is typically correlated between successive intervals. For simplicity, we assume that a single-coefficient predictor is sufficient for minimum mean-square error prediction of this noise sequence. This means that an optimum Viterbi detector would need $16^1=16$ states.

Figure 16:
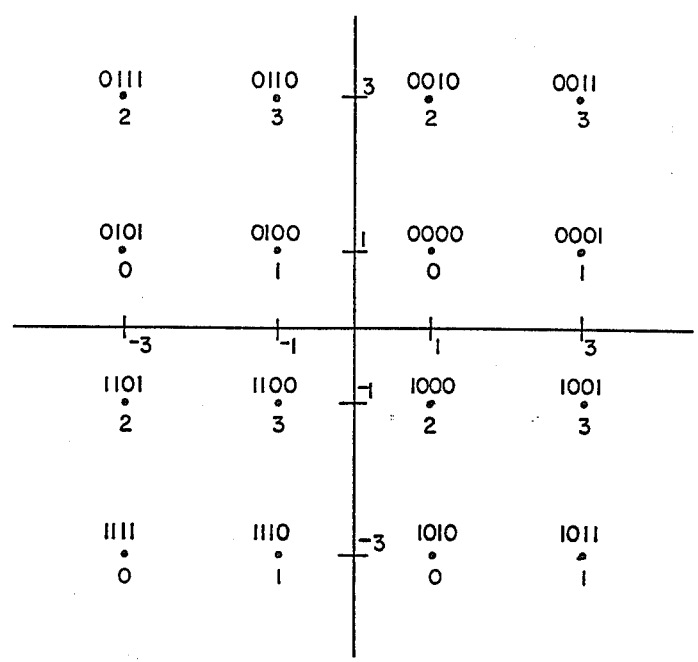
FIG. 16 is a partitioned 16-QAM signal constellation.

The received sequence is fed into modifying circuitry 170 which partitions the signal constellation into four decision subsets according to FIG. 16. When a new signal $r_{new}$ is received the modifying circuitry generates an alternative decision for each subset by choosing the signal points in the subset which are closest to $r_{new}$ in the sense of Euclidean distance. We will denote these decisions as $\hat{C}_{new}(i)$, i=0, 1, 2, 3.

Figure 17:
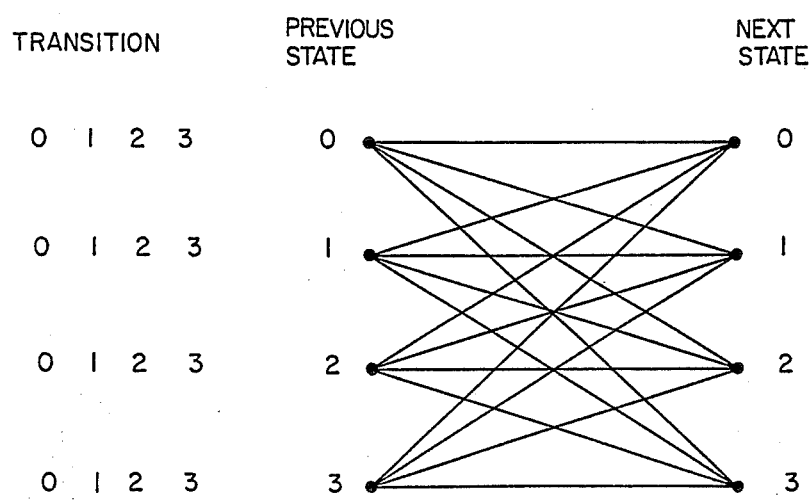
FIG. 17 is a trellis chart.

The received signal $r_{new}$ is modified using alternative decisions from the previous signaling interval:

$$r'_{new}(i) = r_{new} - [r_{old} - \hat{C}_{old}(i)]b_{1, new},$$

i=0, 1, 2, 3, where $b_{1, new}$ is the predictor coefficient. These four modified received signals are fed into Viterbi algorithm device 172. The Viterbi algorithm has only four states defined in terms of the decision subsets. The associated state transition diagram is shown in FIG. 17. Here, four transitions are indicated for each state. Each transition is associated with a decision subset and each actually represents four possible transitions associated with the four signal points in that subset.

For each modified signal the Viterbi algorithm will compute four branch metrics according to $$d^2_{ij} = |r'_{new}(i) - \hat{C}(i, j)|^2,$$

i, j=0, 1, 2, 3.

where $\hat{C}(i, j)$ is the signal point in subset j which is closest to the i'th modified signal $r'_{new}(i)$. Then, for a transition from the i'th state the branch metrics $d^2_{ij}$, i, j=0, 1, 2, 3 will be used. Otherwise, the trellis update can proceed in a conventional manner. The best path history will be identified and the oldest signal point in that path is released as a final decision for delivery to inverse mapping device 174 and parallel-to-serial converter 176. The predictor coefficient can be adaptively updated using tentative decisions from the Viterbi algorithm.

The methods for exploiting noise correlation at the output of a linear equalizer can also be used in other forms of DFE or Viterbi detectors. Other approaches for updating the predictor coefficients can be used.

The 32-state, 4D code used in this application was the invention of Lee-Fang Wei, and is similar to codes described in his United States Patent Application titled Multi-Dimensional Convolutionally Coded Communication Systems, filed April 15, 1985, assigned to the same assignee as this application and incorporated herein by reference.

I claim:

1. A receiver for deciding which signal points were sent from a transmitter based on corresponding noise affected signals received via a distorting channel, said noise affected signals carrying information about a particular sequence of encoding states occupied in a succession of time intervals by a finite state device in said transmitter having a finite number of possible said encoding states, said receiver comprising modifying circuitry for generating a plurality of different modified versions of each said received signal, and a decoder having a finite number of possible decoder states based on said possible encoding states, and for deciding which signal points were sent based on said decoder estimating a particular time sequence of said decoder states corresponding to said particular sequence of encoding states, by storing a number of path histories of previous signal points in said decoder, and using said modified versions to extend said path histories to later time intervals, said different modified versions of each said received signal numbering fewer than said number of said stored path histories.

2. A receiver for deciding which signal points were sent from a transmitter based on corresponding nosie affected signals received via a distorting channel, said noise affected signals carrying information about a particular sequence of encoding states occupied in a succession of time intervals by a finite state device in said transmitter having a finite number of possible encoding states, said receiver comprising modifying circuitry for generating a plurality of different modified versions of each said received signal, and a decoder having a finite number of possible decoder states based on said possible encoding states, for deciding which signal points were sent based on said decoder estimating a particular time sequence of said decoder states corresponding to said particular sequence of encoding states by storing a number of path histories of previous signal points in said decoder, and for partitioning a constellation from which said signal points are drawn into decision subsets and associating transitions from a possible decoder state with one of said decision subsets based on signal points stored in said path histories, each said modified version being associated with one of said decision subsets.

3. A method for deciding which signal points were sent from a transmitter based on corresponding signals received via a noisy distorting channel having an effective memory of K signaling intervals, said received signals carrying information about a particular sequence of encoding states occupied in a succession of time intervals by a finite state device in said transmitter having a finite number of possible said encoding states, said method comprising storing a plurality of path histories with respect to each said encoder state, said path histories having the property that for each encoder state the sequences of K most recent signal points in the associated said path histories belong to respectively different ones of a number of predefined subsets of the set of all possible sequences of K most recent signal points with respect to said encoder state, said number of predefined subsets being fewer than the number of said possible sequences, said stored path histories satisfying the condition that any sequences of K' (K'<K) most recent signal points in all said path histories with respect to each said encoder state do not all correspond respectively to different ones of all possible sequences of K' most recent signal points.

4. A receiver for deciding which signal points were sent from a transmitter based on corresponding signals received via a noisy distorting channel having an effective memory of K signaling intervals, said received signals carrying information about a particular sequence of encoding states occupied in a succession of time intervals by a finite state device in said transmitter having a finite number of possible said encoding states, said receiver comprising a decoder having means for storing a plurality of path histories with respect to each encoder state, said path histories having the property that for each encoder state the sequences of K most recent signal points in the associated said path histories to respectively different ones of a number of predefined subsets of the set of all possible sequences of K most recent signal points with respect to said encoder state, said number of predefined subsets being fewer than the number of said possible sequences, said stored path histories satisfying the condition that if sequences of K' (K'<K) most recent signal points in all said path histories with respect to each said encoder state always correspond respectively to different ones of all possible sequences of K' most recent signal points, then for at least one said path history, the sequence of next K-K' most recent signal points is not allowed to take all possible values of signal points for that encoder state.

5. The receiver of claim 1, 2, or 4 wherein said finite number of encoder states in said transmitter is one.

6. The receiver of claim 1, 2, or 4 wherein said finite state device comprises an encoder in said transmitter for encoding a stream of information symbols into said signal points, said signal points being drawn from a constellation that is partitioned into encoder subsets, possible transitions from one said possible encoding state in a first time interval to one said possible encoding state in a next time interval being associated with said encoder subsets.

7. The receiver of claim 4 wherein said decoder further comprises means for selecting, with respect to each encoder state in a next said time interval, those extensions of path histories for which the resulting path histories have the minimum accumulated metrics from among all said extensions associated with a given one of said predefined subsets.

8. The receiver of claim 1 or 2 wherein said modifying circuitry generates a plurality of alternative decisions for said received signals, said different modified versions being based on different said alternative decisions.

9. The receiver of claim 8 wherein said decoder generates final decisions about which signal point was sent after a plurality of said time intervals have passed, and said modifying circuitry generates said alternative decisions after fewer said time intervals or no delay.

10. The receiver of claim 8 wherein said modifying circuitry associates each said alternative decision with a particular decision subset of possible said signal points.

11. The receiver of claim 10 wherein said decision subsets are formed by partitioning the constellation of all possible said signal points.

12. The receiver of claim 10 wherein
said finite state devices comprises an encoder in said transmitter for encoding a stream of information symbols into said signal points, said signal points being drawn from a constellation that is partitioned into encoder subsets, possible transitions from one said possible encoding state in a first time interval to one said possible encoding state in a next time interval being associated with said encoder subsets, and wherein said decision subsets are the same as said encoder subsets.

13. The receiver of claim 10 wherein
said finite state process comprises an encoder in said transmitter for encoding a stream of information symbols into said signal points, said signal points being drawn from a constellation that is partitioned into encoder subsets, possible transitions from one said possible encoding state in a first time interval to one said possible encoding state in a next time interval being associated with said encoder subsets, and wherein said decision subsets are different from said encoder subsets.

14. The receiver of claim 10 wherein
said finite state device comprises an encoder in said transmitter for encoding a stream of information symbols into said signal points, said signal points being drawn from a constellation that is partitioned into encoder subsets, possible transitions from one said possible encoding state in a first time interval to one said possible encoding state in a next time interval being associated with said encoder subsets, and said decision subsets are unions of said encoder subsets.

15. The receiver of claim 10 wherein said decision subsets have a dimensionality that is larger than the dimensionality of the signal constellation of said signal points.

16. The receiver of claim 10 wherein said modifying circuitry generates said alternative decisions by choosing the signal point in each said decision subset which is closest, in the sense of Euclidean distance, to the most recent said received signals.

17. The receiver of claim 10 wherein said modifying circuitry comprises a plurality of noise predictors, each of which generates one of said modified versions by offsetting each said received signal by a noise prediction value, said noise prediction values for said noise predictors being based on errors between prior said received signals and corresponding said alternative decisions.

18. The receiver of claim 1, 2 or 4 wherein said time interval spans the period required to transmit a plurality of said signal points in a plurality of successive signaling intervals.

19. The receiver of claim 18 wherein each said time interval spans two said signaling intervals.

20. The receiver of claim 1, 2, or 4 wherein said transmitter further comprises a modulator for modulating a carrier in accordance with signal points for transmission over said channel, and said receiver further comprises a demodulator for deriving said noise effected received signal from said modulated carrier.

21. The receiver of claim 1, 2, or 4 wherein said number of path histories is greater than two.

22. The receiver of claim 9 wherein there are four said decision subsets and four said modified versions.

23. The receiver of claim 7 wherein said decoder calculates each said accumulated metric as the sum of a stored path metric plus a branch metric.

24. The receiver of claim 1 or 2 wherein
each said time interval spans a plurality of signaling intervals,
said decoder estimates said particular sequence of decoder states based on estimating the most likely of said possible path histories ending in different ones of possible decoder states in a first time interval, and based on extending said path histories for each said possible decoder state in said first time interval to possible decoder states in a next time interval by means of branch metric calculations with respect to state transitions leading to each of said possible decoder states in the next time interval,
said decoder defines a group of decision subsets of said possible signal points,
said decoder makes said branch metric calculations by finding the Euclidean distance between the modified version associated with a decision subset for the most recent signal points in said path histories and the closest signal point in the said encoder subset of signal points that is associated with the current signaling interval, and
said decoder makes said branch metric calculations successively with respect to each of said signal points spanned by said time interval.

25. The receiver of claim 1 or 2 wherein
said decoder estimates said particular sequence of decoder states based on estimating the most likely of said possible path histories ending in different ones of possible decoder states in a first time interval, and based on extending said path histories for each said possible decoder state in said first time interval to possible decoder states in a next time interval by means of branch metric calculations with respect to state transitions leading to each of said possible decoder states in the next time interval,
said decoder defines a group of decision subsets of said possible signal points, and
said decoder makes said branch metric calculations by finding the Euclidean distance between the modified version associated with a decision subset for the most recent signal points in said path histories and the closest signal point in the said encoder subset of signal points that is associated with the current signaling interval.

26. The receiver of claim 24 wherein said decoder makes said branch metric calculation by finding the Euclidean distance between each said modified version and the nearest signal point in each of said encoder subsets.

27. The receiver of claim 4 wherein said decoder further comprises modifying circuitry for generating a plurality of modified versions of each said received signal.

28. The receiver of claim 1, 2, or 4 wherein said decoder further comprises means for storing path metrics for said path histories.

29. The receiver of claim 4 wherein said decoder comprises means for extending said path histories to include subsequent signal points by using branch metric calculations.

30. The receiver of claim 27 wherein said decoder further comprises means for making branch metric calculations by finding the Euclidean distance between the modified version associated with a path history and the signal points which are possible extensions of said path history.

* * * * *

UNITED STATES PATENT AND TRADEMARK OFFICE
CERTIFICATE OF CORRECTION

PATENT NO. : 4,713,829

DATED : December 15, 1987

INVENTOR(S) : Vedat M. Eyuboglu

It is certified that error appears in the above-identified patent and that said Letters Patent is hereby corrected as shown below:

Col. 14, line 57, "decoder" should be --encoder--.

Col. 15, line 5, "becuase" should be --because--.

Col. 15, line 12, "use" should be --used--.

Col. 17, claim 4, line 51, after "histories", insert --belong--.

Col. 18, claim 12, line 34, "devices" should be --devices--.

Col. 18, claim 13, line 46, "process" should be --device--.

Signed and Sealed this

Fourteenth Day of November, 1989

*Attest:*

JEFFREY M. SAMUELS

*Attesting Officer*  *Acting Commissioner of Patents and Trademarks*